United States Patent
Mitchell et al.

[11] Patent Number: 5,159,570
[45] Date of Patent: Oct. 27, 1992

[54] FOUR MEMORY STATE EEPROM

[75] Inventors: Allan T. Mitchell, Garland; Howard L. Tigelaar, Allen, both of Tex.

[73] Assignee: Texas Instruments Incorporated, Dallas, Tex.

[21] Appl. No.: 697,228

[22] Filed: May 7, 1991

Related U.S. Application Data

[60] Division of Ser. No. 288,497, Dec. 22, 1987, abandoned, which is a continuation-in-part of Ser. No. 137,401, Dec. 23, 1987, abandoned.

[51] Int. Cl.[5] ............................................. G11C 13/00
[52] U.S. Cl. ...................................... 365/185; 365/182
[58] Field of Search .................. 365/185, 182, 189.01

[56] References Cited

U.S. PATENT DOCUMENTS

| | | | |
|---|---|---|---|
| 4,811,067 | 3/1989 | Fitzgerald et al. | 365/149 |
| 4,907,047 | 3/1990 | Kato et al. | 365/149 |

*Primary Examiner*—Terrell W. Fears
*Attorney, Agent, or Firm*—Ira S. Matsil; James C. Kesterson; Richard L. Donaldson

[57] ABSTRACT

An EEPROM memory cell having sidewall floating gates (28, 28a, 28b) is disclosed. Sidewall floating gates (28, 28a, 28b) are formed on sidewalls (30, 32) of a central block (22). Spaced apart bit lines (36, 36a, 36b) are formed to serve as memory cell sources and drains. Sidewall floating gates (28a, 28b) are capable of being programmed independently of one another. When control gate (18) is actuated and either bit line (36a) or bit line (36b) is used to read the device, four separate memory states may be identified depending on whether either, neither or both of the sidewall floating gates (28a, 28b) have been programmed.

5 Claims, 2 Drawing Sheets

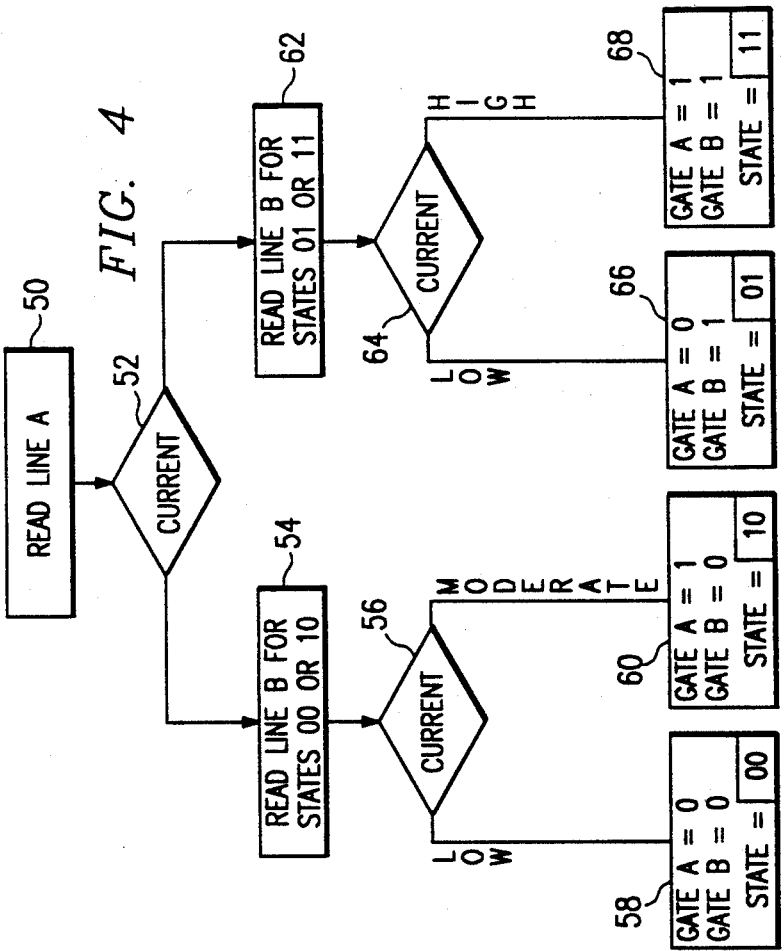
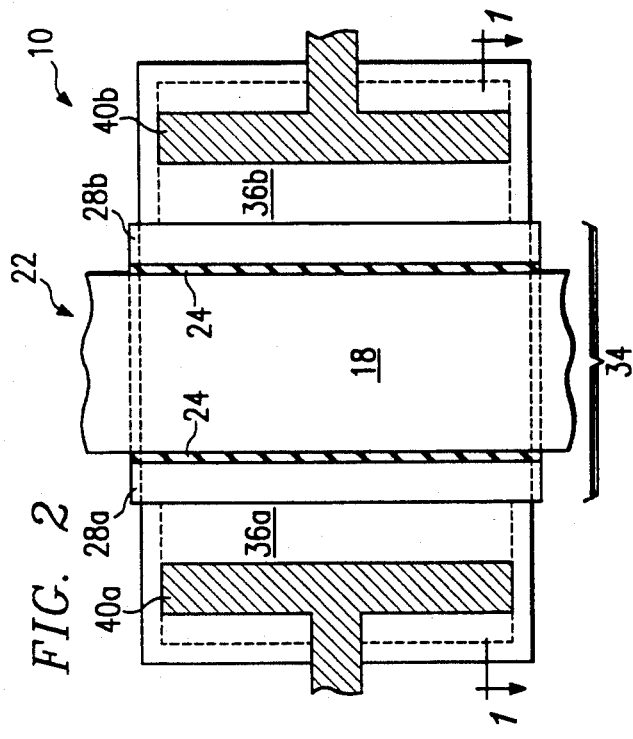
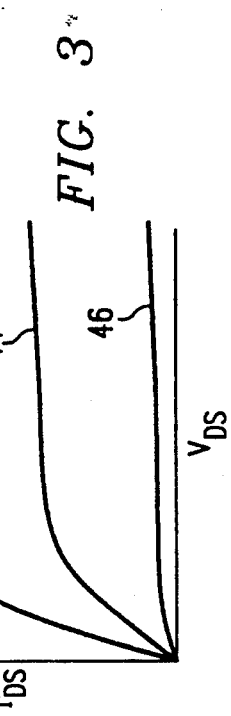

FOUR MEMORY STATE EEPROM

This is a division of application Ser. No. 07/288,497, filed Dec. 22, 1988, now abandoned, which is a continuation-in-part of Ser. No. 07/137,401, filed Dec. 23, 1987, abandoned.

TECHNICAL FIELD OF THE INVENTION

This invention relates to the field of electrically erasable programmable read only memory (EEPROM) semiconductor devices. Specifically, the present invention relates to an EEPROM cell having increased memory storage capabilities due to two floating gate structures contained within each cell.

BACKGROUND OF THE INVENTION

One of the goals in the fabrication of electrically erasable programmable read only memories (EEPROMs) is the production of memory circuits which are capable of storing a maximum amount of information using a minimum amount of semiconductor surface area. However, photolithographic limits imposed by conventional semiconductor processing technology impede the achievement of this goal. Thus, an inability to pattern and etch semiconductor features beyond current physical limits prevents a memory cell from being constructed having the desired minimum semiconductor surface area.

EEPROMs often use a floating gate avalanche injection MOS (FAMOS) structure to store program information. One solution to the problem of dimensioning a floating gate at minimum photolithographic limits is provided by the use of a single sidewall floating gate formed on a sidewall of the control gate. However, since such a floating gate is merely added to a sidewall of an ordinary photolithographically defined control gate, the resulting structure is generally no smaller than a conventional FAMOS structure and achieves no greater memory storage capabilities. Accordingly, a need exists for a memory cell in which a floating gate structure is used to increase the storage capacity of the memory cell while maintaining the size of the cell at an acceptably small magnitude.

SUMMARY OF THE INVENTION

One aspect of the present invention comprises an EEPROM memory cell wherein the memory cell has a pair of sidewall floating gates formed adjacent the control gate. A technical advantage of the present invention is that this cell is capable of four distinct states and therefore can hold two bits of memory as opposed to the two distinct states and single bit storage capability of a conventional cell. Memory storage capabilities are doubled without a comparable increase in memory cell size.

According to another aspect of the invention, an EEPROM memory cell has first and second regions of one conductivity type formed on a semiconductor surface of a different conductivity type so that the first and second regions function as a source and drain for the memory cell. A channel region is defined between the first and second regions and is divided into three subregions. A central subregion is controlled by a control gate separated from the semiconductor surface by a control gate insulator. Two outside floating gate channel regions flanking the central region are controlled by sidewall floating gate filaments. These sidewall floating gate filaments may be programmed independently of each other and the cell may then be read using either the source or the drain to define four distinct memory states.

BRIEF DESCRIPTION OF THE DRAWINGS

A more complete understanding of the present invention may be acquired by referring to the detailed description and claims when considered in connection with the accompanying drawings, in which like reference numbers indicate like features throughout the drawings, and wherein:

FIG. 2 is a plan view of a single EEPROM cell, in which line 1—1 corresponds to the cross section represented in FIGS. 1a through 1e;

FIG. 3 is a flow chart showing the method used to read the memory state of the present invention; and FIG. 4 shows voltage versus current curves applicable to read operations of the present invention.

DETAILED DESCRIPTION OF INVENTION

FIGS. 1a through 1e illustrate processing steps for the fabrication of an EEPROM memory array according to the present invention.

A memory array contains a multiplicity of memory cells. Typically, all memory cells within a memory array are constructed as a result of the same process steps, and therefore, all cells are similar in structure. Consequently, an entire array (not shown) of memory cells is described herein by reference only to a single cell, indicated generally at 10, depicted in FIGS. 1a through 1e. It will be understood by those skilled in the art that many memory cells may reside on either side of the cells depicted in FIGS. 1a through 1e. In addition, many memory cells may reside both above and below the cells shown in FIGS. 1a through 1e in a direction perpendicular to the sectional plane shown.

Figure 1A:
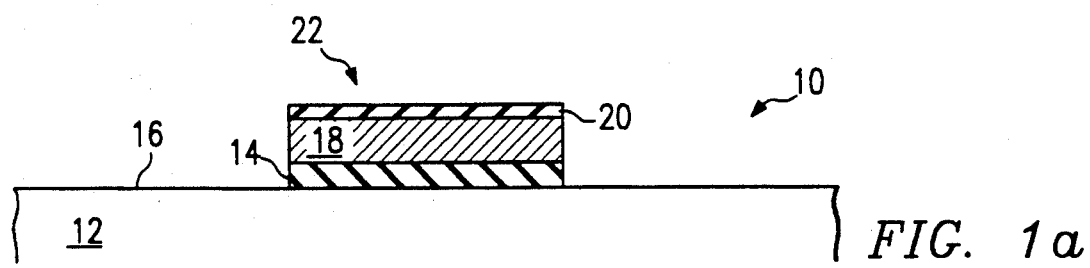
FIGS. 1a through 1e are elevational schematic cross sectional views of successive processing steps for building a single EEPROM memory cell according to the present invention.

Memory cell 10 includes a (P) type semiconductor substrate 12 upon which the processing steps depicted in FIG. 1a are performed. First, a thin oxide layer 14 is formed at a semiconductor substrate surface 16 of substrate 12. Oxide layer 14 may advantageously be grown in a dry oxygen or steam environment at a temperature of approximately 900° C. until a thickness of approximately 350 Angstroms has been achieved. Oxide layer 14 initially covers the entire surface 16 of array 10 (initial state not shown). After the formation of oxide layer 14, a layer 18 of polycrystalline or amorphous material comprising silicon is deposited on oxide layer 14. Layer 18 is formed to be of a thickness on the order of one micron. After the deposition of this conductive layer, a second layer 20 of oxide is grown or deposited thereover.

A conventional pattern and etch process is conducted on the layers to reexpose the majority of semiconductor substrate surface 16, leaving a central block indicated generally at 22 shown in FIG. 1a. Block 22 includes control gate 18 disposed between oxide layers 14 and 20. Control gate 18 may comprise any one of a variety of conductive materials, for example, polycrystalline or amorphous silicon, refractory metals or silicide.

Figure 1B:
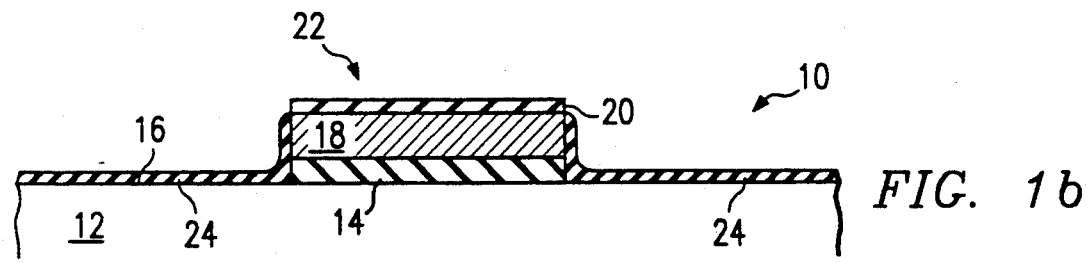

Referring now to FIG. 1b, a thin oxide layer 24 is grown over semiconductor substrate surface 16 and exposed nonoxide sidewall surfaces of central block 22.

Oxide layer 24 is of a thickness on the order of 100 Angstroms.

Figure 1C:
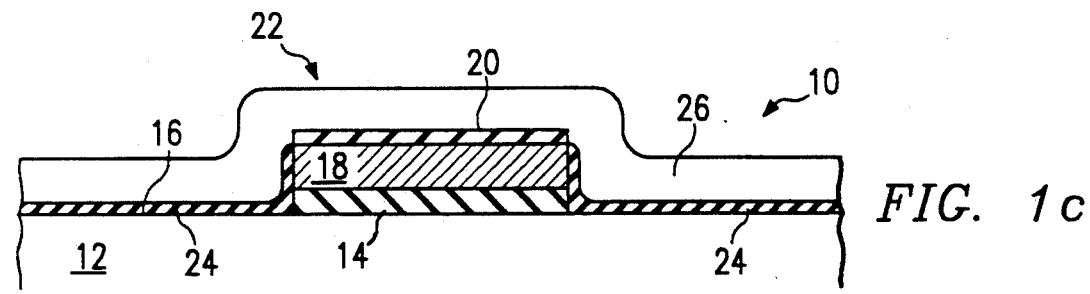

As shown in FIG. 1c, the next step is a conformal deposition of a second conductive layer 26 of polycrystalline or amorphous material comprising silicon. Conductive layer 26 is initially formed to be of a thickness on the order of 3000 Angstroms. After deposition, second conductive layer 26 is doped in situ using $POCl_3$, for example, and then anisotropically etched using an etchant which is selective to oxide.

Figure 1D:
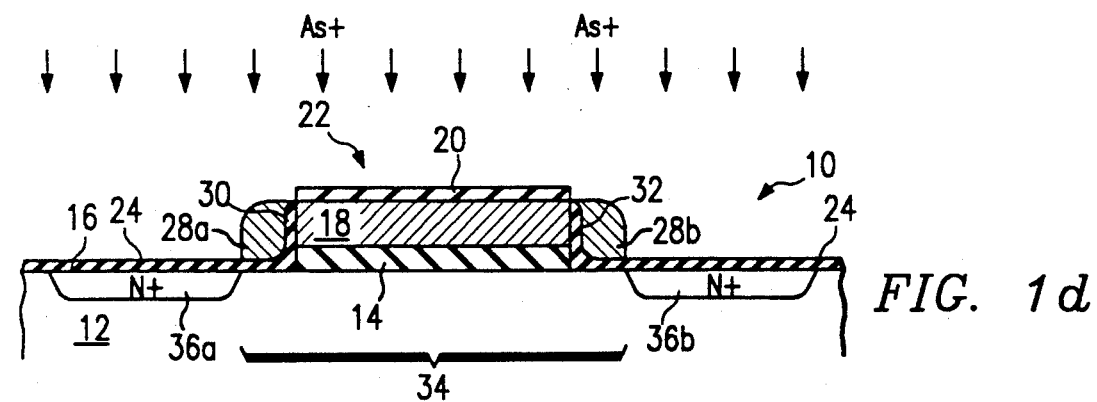

As a result of this etching process, as shown in FIG. 1d, sidewall floating gate filaments 28a and 28b are formed on sidewalls 30 and 32 of central block 22. Sidewall floating gate filaments 28a and 28b are insulatively separated from substrate surface 16 of substrate 12 and from central block 22 by oxide layer 24. The thicker control gate 18 is formed, the better the control over sidewall floating gate filaments 28a and 28b due to the increased surface area of the sidewalls of control gate 18.

Sidewall floating gate filaments 28a and 28b and central block 22 are disposed over the substrate surface 16 to define a channel region 34 of an EEPROM transistor. An ion implantation procedure then implants an (N+) dopant into substrate 12 adjacent each side of the channel region 34. Although any conventional (N+) dopant may be used, the preferred embodiment of the present invention uses arsenic at a concentration of approximately $5 \times 10^{15}$ atoms per square centimeter, and at an energy level of approximately 60 KeV. Arsenic is preferred over, for example, phosphorus because arsenic diffuses away from the area in which it is implanted less than phosphorus. As a consequence of implanting the dopant ions, (N+) bit lines 36a and 36b are formed in substrate 12 at substrate surface 16. Bit lines 36a and 36b function as sources and drains for memory cell transistors and extend the entire length of the memory array. The implant of the (N+) dopants may take place through oxide layer 24 due to its thin nature without requiring removal of oxide layer 24 from the selected bit line sites.

Figure 1E:
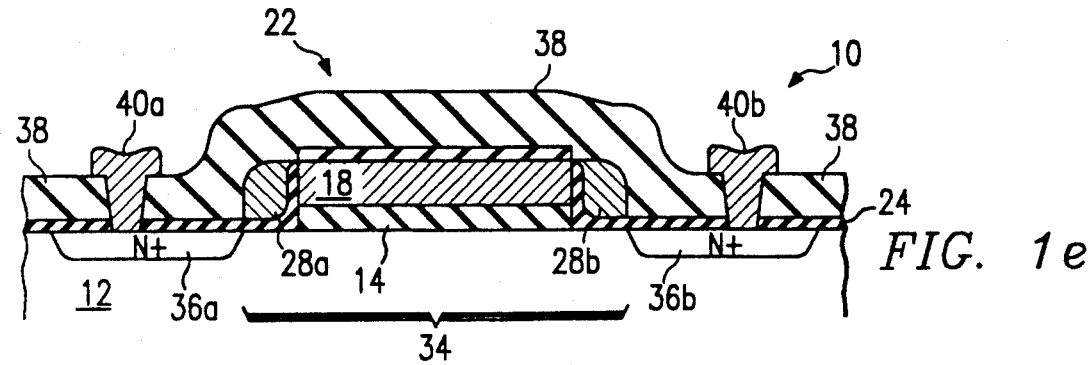

The final cross sectional structure of the present memory cell is shown in FIG. 1e and is accomplished by the additional process steps of depositing an insulator oxide layer 38 and forming electrical contacts 40a and 40b therethrough to provide electrical connection with bit lines 36a and 36b.

A plan view of the memory cell is shown in FIG. 2 indicating a line 1—1 where the cross section shown in FIG. 1e is located. Control gate 18 may be seen to be centered in the memory cell, with oxide layers 24 extending along opposite sides of control gate 18. Sidewall floating gate filaments 28a and 28b are disposed between oxide layers 24 and bit lines 36a and 36b. Electrical contacts 40a and 40b extend over and into contact with bit lines 36a and 36b. Sidewall floating gates 28a and 28b are truncated and do not extend the full length of the control gate 18. This is done with mask and poly etch process steps after the sidewall filament formation. The sidewall floating gates 28a and 28b formed in this way are fully isolated and surrounded by oxide, and therefore can store electric charge.

In operation, the memory cell 10 is programmed by causing hot electrons to be injected through gate oxide 24 into one of, both of or neither of the floating gates 28a and 28b. This injection of electrons occurs under the influence of a relatively strong electrical field. Once the strong electrical field has been removed, these electrons are trapped in floating gates 28a and 28b causing the memory cell to be programmed.

Floating gates 28a and 28b may be programmed independently of one another. As a result, the memory cell may be programmed to store up to four distinct information states. For example, a first information state may be represented by leaving both of sidewall floating gates 28a and 28b unprogrammed. A second information state may be represented by programming only sidewall floating gate 28a and not sidewall floating gate 28b. A third information state may be represented by programming only sidewall floating gate 28b and not sidewall floating gate 28a, and a fourth information state may be represented by programming both sidewall floating gates 28a and 28b.

Sidewall floating gate 28a is programmed by applying a zero volt potential to bit line 36a, which then acts as the drain of the memory cell. A relatively high positive voltage pulse is then applied on control gate 18. Bit line 36b is allowed to float to prevent the programming of sidewall floating gate 28b.

Likewise, floating gate 28b is programmed by applying a zero volt potential to bit line 36b and applying a relatively high voltage pulse to control gate 18. Bit line 36a is allowed to float to prevent the programming of sidewall floating gate 28a. Both of floating gates 28a and 28b within a memory cell may be programmed in two steps by first programming one of the sidewall floating gates 28a and 28b as discussed above, then programming the other of sidewall floating gates 28a and 28b.

A particular memory cell is read by applying moderate voltages, such as in the range of 3 to 5 volts, to a particular source, drain and control gate that uniquely define the memory cell. FIG. 3 shows a graph of relationships between drain to source voltage levels and current levels which occur when reading a memory cell. The above described four distinct information states may be detected by sensing current flowing in the cell under various conditions. For example, curve 42 represents the ability of memory cell 10 to conduct current during a read operation when neither of sidewall floating gates 28a and 28b are programmed. In this situation, memory cell 10 conducts a relatively large amount of current at a relatively low or moderate drain to source voltage potential and it makes no difference which of bit lines 36a and 36b are used as the source and drain for the read operation due to its symmetrical construction.

A curve 44 shows the electrical behavior of memory cell 10 during a read operation when only sidewall floating gate 28a has been programmed and memory cell 10 is being read with bit line 36a serving as the drain. Curve 44 also depicts the relationship of voltage to current which results during a read operation when only sidewall floating gate 28b has been programmed and memory cell 10 is being read with bit line 36b serving as the drain. For both of these situations, memory cell 10 conducts a moderate amount of current when a moderate voltage potential is applied between its drain and source.

Moreover, a single curve 46 shown in FIG. 3 illustrates the performance of memory cell 10 during a read operation for each of three additional situations. For example, the response illustrated by curve 46 occurs when both of sidewall floating gates 28a and 28b have been programmed and either bit line 36a or 36b is used as the drain during the read operation. This response also occurs when only sidewall floating gate 28a has been programmed and memory cell 10 is being read with bit line 36b serving as the drain. Finally, this response also occurs when only sidewall floating gate 28b has been programmed and memory cell 10 has been read with bit line 36a serving as the drain. In each of these three situations, a relatively low amount of current flows through memory cell 10 when a moderate voltage potential is applied between its drain and source.

FIG. 4 illustrates the flow chart of a process whereby the state of memory cell 10 may be determined using two successive read operations. Memory cell 10 is capable of being in four distinct information states and can thereby store two bits of information. It is very difficult to distinguish between the high current level represented by curve 42 in FIG. 3 and the moderate current level represented by curve 44. Accordingly, using the process illustrated in FIG. 4, the state of memory cell 10 can be determined without having to make this difficult distinction.

A first read step is performed on the memory cell 10 with either bit line 36a or 36b serving as the drain or "line A" as shown in block 50 on FIG. 4. At block 52, a decision is made whether memory cell 10 is conducting a low amount of current or a high or moderate amount of current. If memory cell 10 is conducting a low amount of current, a second read operation occurs in block 54 using line B, the opposite bit line from that used in step 50 described above. Because a low amount of current was found in decision block 52, it is known that "gate B", the gate opposite from the bit line being read, is programmed and is storing charge. The second read operation is necessary to determine if gate A has been programmed and is storing charge. Hence, the two possible information states are shown in block 54 as state "00" or state "10". The first digit of each state shown in block 54 represents the state of gate A and the second digit represents the state of gate B. A "0" represents that the gate is storing charge and a "1" represents that the gate is not storing charge.

After the read operation in block 54 a decision is made at block 56 to determine whether memory cell 10 is conducting a low or moderate amount of current when line B is used for read operation. If a low amount of current is detected at 56, both gates A and B are storing charge and an information state "00" has been detected as shown in block 58. If a moderate amount of current is detected at 56, gate A has not been programmed to store charge and an information state "10" has been detected as shown in block 60.

If a high or moderate amount of current is detected at 52, it indicates that gate B is not storing charge. A second read operation is then performed at 62 using line B to determine whether gate A is storing charge. If a low amount of current is detected at decision block 64, gate A has been programmed and is storing charge. This indicates an information state "01" has been detected as shown in block 66. If a high amount of current is detected at 64, neither gate A nor B is storing charge and an information state "11" is indicated as shown in block 68. Using the process shown in FIG. 4, the four possible information states of memory cell 10 may be determined without having to distinguish between a high and a moderate amount of current.

The memory cell of the present invention is wholly symmetrical. Therefore, although FIG. 4 shows that bit line "A" is read first in the "read" operation, either bit line may be read first with no detectable difference in performance. Hence, referring to FIG. 1e, either bit line 36a or 36b could be read first as line A in the read operation shown in FIG. 4. This symmetry provides an important technical advantage of the present invention in that the software necessary to perform the "read" operation may be designed with much greater flexibility.

Sidewall floating gate 28b shown in FIG. 2 is electrically erased by holding the control gate 18 at ground potential and applying a relatively high voltage pulse to bit line 36b. Bit line 36a can be grounded or left floating while erasing sidewall floating gate 28b. Sidewall floating gate 28a is electrically erased in a similar manner by holding the control gate 18 at ground potential and applying a relatively high voltage pulse to bit line 36a.

In summary, a memory array having two independent sidewall floating gates and a control gate has been described. As a consequence of this structure, the present invention is capable of storing four distinct information states or two bits of information in an area comparable to the cell sizes of conventional memory cells manufactured by conventional photolithographic techniques. Of course, these dimensions reflect current processing capabilities and such dimensions may decrease as a result of improvements in semiconductor processing techniques.

The foregoing description uses preferred embodiments and processes to illustrate the present invention. However, changes and modifications may be made in these embodiments without departing from the scope of the present invention. For example, the present invention describes insulation layer 24 as being comprised of oxide. Insulation layer 24 may alternatively be formed of a dielectric comprising a first layer of oxide followed by a layer of nitride followed by a second layer of oxide forming a highly effective dielectric layer between sidewall floating gate filaments 28a and 28b and control gate structure 22 and substrate 12. These and other modifications are intended to be included within the scope of the present invention.

While the invention is illustrated by the embodiments in the above detailed description, it is not limited to these embodiments but rather only by the scope and spirit of the claims which follow.

What is claimed is:

1. A method of storing information in a memory cell having first and second sidewall gates and a channel gate insulatively disposed therebetween, the channel gate and the first and second sidewall gates overlying a channel region, the first and second sidewall gates capable of being programmed independently, the method comprising the steps of:

refraining from programming either of the first and second sidewall gates to define a first information state;

programming both the first and second sidewall gates to define a second information state;

said programming of said second sidewall gate comprising the steps of placing an actuating voltage on the channel gate;

placing a predetermined voltage level on a portion of the channel region insulatively disposed adjacent the first sidewall gate; and pulsing a portion of the channel region insulatively disposed adjacent the second sidewall gate at a voltage level higher than the predetermined voltage level.

2. The method of claim 1, further comprising the step of programming the first sidewall gate while refraining from programming the second sidewall gate to define a third information state.

3. The method of claim 2, further comprising the step of programming the second sidwall gate while refraining from programming the first sidewall gate to define a fourth information state.

4. A method of determining the information stored in a memory cell having first and second floating gates and a control gate all overlying a channel region, the method comprising the steps of:

forming a depletion region in the channel region;

inducing a first current through the channel region;

sensing a level of the first current to determine a programmed state of the first floating gate, the first floating gate capable of being in one of two programmed states, the level of the first current being within a first range of current levels defining a first programmed state of the first floating gate, the level of the first current being within a second range of current levels defining a second programmed state of the first floating gate;

inducing a second current through the channel region to flow in a direction opposite to the first current;

sensing a level of the second current to determine a programmed state of the second floating gate, the second floating gate capable of being in one of two programmed states, the level of the second current being within the first range of current levels defining a first programmed state of the second floating gate, the level of the second current being within the second range of current levels defining a second programmed state of the second floating gate; and determining which of four combinations of the first and second programmed states exist on the floating gates to yield a respective one of four information states of the memory cell.

5. A method of storing information in a memory cell having first and second sidewall gates and a channel gate insulatively disposed therebetween, the channel gate and the first and second sidewall gates overlying a channel region, said memory cells having a first state where neither of said first and second sidewall gates are programmed, a second state where only said first sidewall gate is programmed, a third state where only said second sidewall gate is programmed and a fourth state where both said first and second sidewalls are programmed, the programming of said memory cell for said fourth state comprising the steps of:

placing an actuating voltage on the channel gate;

placing a predetermined voltage level on a first portion of the channel region insulatively disposed adjacent the second sidewall gate;

placing a voltage pulse on a portion of the channel region insulatively disposed adjacent the first sidewall gate at a level higher than the predetermined voltage level;

removing said predetermined voltage from said first portion of the channel region;

placing a predetermined voltage level on a second portion of the channel region insulatively disposed adjacent the first sidewall gate; and placing a voltage pulse on a portion of the channel region insulatively disposed adjacent the second sidewall gate at a voltage level higher than the predetermined voltage level.

* * * * *